US008593308B1

(12) United States Patent
Biran et al.

(10) Patent No.: US 8,593,308 B1
(45) Date of Patent: Nov. 26, 2013

(54) METHOD OF ACCELERATING DYNAMIC HUFFMAN DECOMPACTION WITHIN THE INFLATE ALGORITHM

(75) Inventors: Giora Biran, Zichron-Yaakov (IL); Amit Golander, Tel-Aviv (IL); Shai I Tahar, Petach Tikva (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/484,296

(22) Filed: May 31, 2012

(51) Int. Cl.
*H03M 7/40* (2006.01)
(52) U.S. Cl.
USPC ............. 341/65; 341/67; 341/79; 341/106; 341/107
(58) Field of Classification Search
USPC ................... 341/65, 67, 79, 106, 107
See application file for complete search history.

(56) References Cited

U.S. PATENT DOCUMENTS

| 5,528,628 | A | | 6/1996 | Park et al. | |
|---|---|---|---|---|---|
| 5,604,498 | A | * | 2/1997 | Park | 341/65 |
| 5,848,195 | A | | 12/1998 | Romriell | |
| 5,953,503 | A | | 9/1999 | Mitzenmacher et al. | |
| 6,621,429 | B2 | * | 9/2003 | Tsuchido et al. | 341/65 |
| 6,919,827 | B2 | * | 7/2005 | Kim et al. | 341/65 |
| 6,982,661 | B2 | * | 1/2006 | Acharya et al. | 341/65 |
| 7,283,591 | B2 | * | 10/2007 | Ruehle | 375/253 |
| 7,307,552 | B2 | | 12/2007 | Ma et al. | |
| 7,358,870 | B2 | * | 4/2008 | Bay | 341/65 |
| 7,549,058 | B1 | * | 6/2009 | Wang et al. | 713/189 |
| RE41,152 | E | | 2/2010 | Reynar et al. | |
| 7,796,059 | B2 | | 9/2010 | Ylonen | |
| 7,834,781 | B2 | | 11/2010 | Biran et al. | |
| 8,306,108 | B2 | * | 11/2012 | Lu et al. | 375/240.02 |
| 2002/0009153 | A1 | | 1/2002 | Jeon et al. | |
| 2004/0164882 | A1 | | 8/2004 | Touyama et al. | |
| 2008/0144728 | A1 | * | 6/2008 | Ruehle | 375/253 |
| 2009/0228284 | A1 | | 9/2009 | Moon et al. | |
| 2010/0013679 | A1 | * | 1/2010 | Tung et al. | 341/65 |
| 2010/0281079 | A1 | | 11/2010 | Marwah et al. | |
| 2012/0319875 | A1 | * | 12/2012 | Lee et al. | 341/65 |

FOREIGN PATENT DOCUMENTS

JP  2008107615  5/2008

OTHER PUBLICATIONS

Peter Deutsch, "DEFLATE Compressed Data Format Specification version 1.3", May 1996.
Wikipedia, the free encyclopedia, "DEFLATE", Nov. 2011.
Wikipedia, the free encyclopedia, "Huffman coding", Nov. 2011.
Suzanne Rigler, "FPGA-Based Lossless Data Compression Using GNU Zip", 2007.
Cannane et al., "A Compression Scheme for Large Databases", Database Conference, 2000. ADC 2000, Proceedings. 11th Australasian, Publisher: IEEE, 2000.
Tharini et al., "An Efficient Data Gathering Scheme for Wireless Sensor Networks", European Journal of Scientific Research ISSN 1450-216X vol. 43 No. 1, pp. 148-155, Publisher: EuroJournals Publishing, Inc, 2010.

* cited by examiner

*Primary Examiner* — Linh Nguyen

(57) ABSTRACT

A system and method of accelerating dynamic Huffman decompaction within the inflate algorithm. To improve the performance of a decompression engine during the inflate/decompression process, Huffman trees decompacted a priori are used thus eliminating the requirement of decompacting the DHT for each input stream. The Huffman tree in the input stream is matched prior to decompaction. If a match is found, the stored decompacted Huffman tree is used which reduces the required decompression time.

7 Claims, 3 Drawing Sheets

METHOD OF ACCELERATING DYNAMIC HUFFMAN DECOMPACTION WITHIN THE INFLATE ALGORITHM

FIELD OF THE INVENTION

The present invention relates to the field of data compression, and more particularly relates to a method of accelerating dynamic Huffman decompaction within the inflate algorithm.

BACKGROUND OF THE INVENTION

The explosion of data, both in motion (i.e. network) and at rest (i.e. storage), raises the need for better compression solutions. Currently, the networking industry uses compression to lower the network bandwidth requirements for growing portions of the internet traffic. Recently, the primary storage industry started using compression to lower the exponentially growing storage capacity requirements. Huffman encoding is a key part of standard compression algorithms. It has two versions, one for optimal quality (i.e. ratio) and the other for optimal performance (i.e. rate). To maintain high data throughput, faster and faster algorithms are required for decompression.

SUMMARY OF THE INVENTION

There is thus provided in accordance with the invention, a method of accelerating dynamic Huffman decompaction within an inflate process, the method comprising receiving an input stream of compressed data, providing a bank of compacted and decompacted Huffman trees, determining the compacted Huffman in the input stream from the bank of compacted Huffman and loading the decompacted Huffman tree from the bank.

There is also provided in accordance with the invention, a system for accelerating dynamic Huffman decompaction within an inflate process, comprising receiving means for receiving an input stream of compressed data, a bank of compacted and decompacted Huffman trees, means for determining the compacted Huffman in the input stream from the bank of compacted Huffman and means for loading the decompacted Huffman tree from the bank.

There is further provided in accordance with the invention, a method of accelerating dynamic Huffman decompaction within an inflate process, the method comprising receiving an input stream of compressed data, providing a bank of compacted and decompacted Huffman trees, matching the Huffman dictionary to know presets, if a match is found, loading the Huffman tree and if a match is not found, decompacting the Huffman dictionary into a Huffman tree and decoding the compressed input stream using the Huffman tree from the bank.

BRIEF DESCRIPTION OF THE DRAWINGS

The invention is herein described, by way of example only, with reference to the accompanying drawings, wherein.

DETAILED DESCRIPTION OF THE INVENTION

Figure 1:
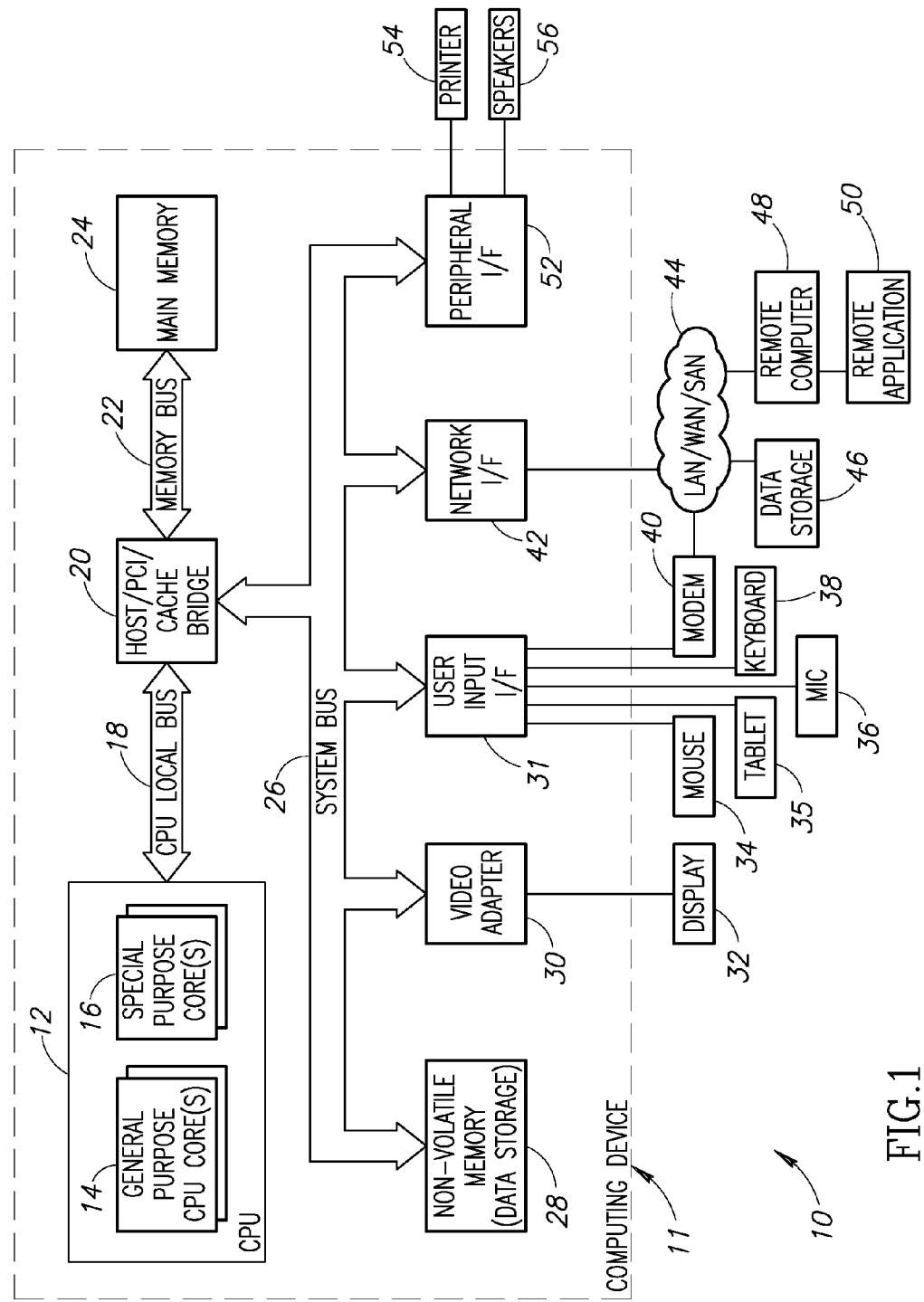
FIG. 1 is a block diagram illustrating an example computer processing system adapted to implement the electronic catalog system of the present invention.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that performs particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device.

Computer program code for carrying out operations of the present invention may be written in any combination of one or more programming languages, including an object oriented programming language such as Java, Smalltalk, C++, C# or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

A block diagram illustrating an example computer processing system adapted to implement the electronic catalog system of the present invention is shown in FIG. 1. The exemplary computer processing system, generally referenced 10, for implementing the invention comprises a general purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, etc.). The one or more general purpose cores execute general purpose opcodes while the special purpose cores executes functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (UF) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Deflate is the most popular lossless data compression algorithm defined in RFC 1951. It uses a combination of the Lempel-Ziv algorithm (LZ77) that eliminates repetitions and Huffman coding. Huffman encoding uses a variable-length code table based on entropy to encode source symbols. It is defined either as either Static or Dynamic In Static Huffman coding, each literal or distance is encoded using a fixed table (SHT) that is defined in the RFC. In Dynamic Huffman coding, however, special coding tables (DHT) are constructed to better suit the statistics of the data being compressed. In most cases, using DHT achieves better compression ratio (i.e. quality) when compared to SHT, at the expense of degrading the compression rate (i.e. performance) and adding design complexity.

Using Dynamic Huffman encoding increases the compression ratio in comparison to using Static Huffman encoding, but is typically time consuming and requires complex hardware. One solution to improve the compression ratio while maintaining good performance is to analyze the first part of the incoming data stream and speculatively select a predefined preset dictionary to be used on the entire data (instead of a generic static dictionary). A high level of correlation was found between the statistics of files with similar nature (e.g., two English text files). Such a level of correlation is exploited to compose predefined DHT presets. A matching preset yields the best of both worlds: a close-to DHT compression ratio with close-to SHT compression rate.

The dynamic Huffman method does not have as high a compression rate as is possible. Constructing dynamic dictionaries adds computational overhead and worse, requires a sequential three step process that traverses the payload twice. In a first step, the LZ77 algorithm is performed while gathering statistics, including output literal, length and distance frequency. In a second step, statistics are used to construct the literal and length DHT and the distances DHT. Constructing a DHT requires sorting the frequencies, constructing dynamic Huffman trees, transforming it into a canonic DHT and creating a compacted form to be sent alongside the compressed data block. In a third step, the LZ77 output is encoded with the constructed DHTs. The dominant factor degrading compression rate is the second step for small input blocks and the first and third steps for larger inputs. Steps 1 and 3 traverse the payload, hence DHT is a two-pass algorithm.

The deflate algorithm partitions the input stream into blocks and every block is encoded by itself. The two-pass flow requires that intermediate block results be stored which consume several tens of kilobytes, so in software implementations they are likely to overflow to the L2 cache between steps 1 and 3. Hardware implementations, even if they supported DHT, would require either SRAMs which consume chip real estate, caches larger than L1 caches or moving all intermediate results back and forth to memory over the chip interconnect, which is likely to create bottlenecks degrading performance even more.

An explosion in network traffic has forced many edge-of-network applications, such as WAN acceleration, to use hardware accelerators. Hardware accelerators may process an input byte per cycle compared to 100 CPU cycles or so required in software implementations for the same task. These hardware accelerators commonly support dynamic Huffman decompression, but lack that support in the compression path. Settling for static Huffman encoding, as a one-pass algorithm, simplifies the hardware design and enables a high compression rate at the expense of offering a lower compression ratio.

Use of a predefined Huffman dictionary reduces the complexity and increases performance. For example, a dictionary selection mechanism effectively breaks the built-in tradeoff between compression ratio and rate for both software and hardware implementations. The dictionary selection mechanism achieves high compression rate and ratio leveraging predefined Huffman dictionaries (also known as presets) and provides a mechanism for dynamically speculating which predefined dictionary to select per input data block.

A bank of predefined Huffman dictionaries can be automatically generated for a set of input data files. A predefined Huffman dictionary is dynamically and speculatively selected from the bank of dictionaries, thereby achieving close to a dynamic Huffman ratio at a static Huffman rate.

Dynamic Huffman encoding defines two Huffman trees, one for literals and lengths and one for distances. Usage of predefined Huffman dictionaries is based on the assumption that similar data types have similar distributions for literals, lengths and distances. Literals in text files for instance will always use many alphabet letters and more vowels than consonants. This phenomenon will remain even after LZ77 repetitions are removed.

It has also been found that length and distance frequencies are also similar between similar file types. Nevertheless, being based on repetitions the frequency distribution is sensitive to two key parameters: the LZ77 implementation and the location of the data being compressed within the stream.

The usage of predefined Huffman dictionaries requires the creation of a bank of dictionaries. In one embodiment, creating a predefined Huffman dictionary is an off-line process that typically is run before the system is built or installed or is run in the background so as to not consume real-time resources. Customers and application can create their own dictionary banks using the automatic bank creation process.

Sending a predefined DHT maintains backward compatibility to other decompressions but 'wastes' time during decompaction. Using the method of the present invention, this time can be saved by utilizing a mechanism to detect predefined compacted dictionaries in the input compressed data stream and to load the appropriate Huffman tree rather than compute it. This mechanism is based on the assumption that when using predefined compacted Huffman trees, these trees tend to naturally repeat themselves.

Figure 2:
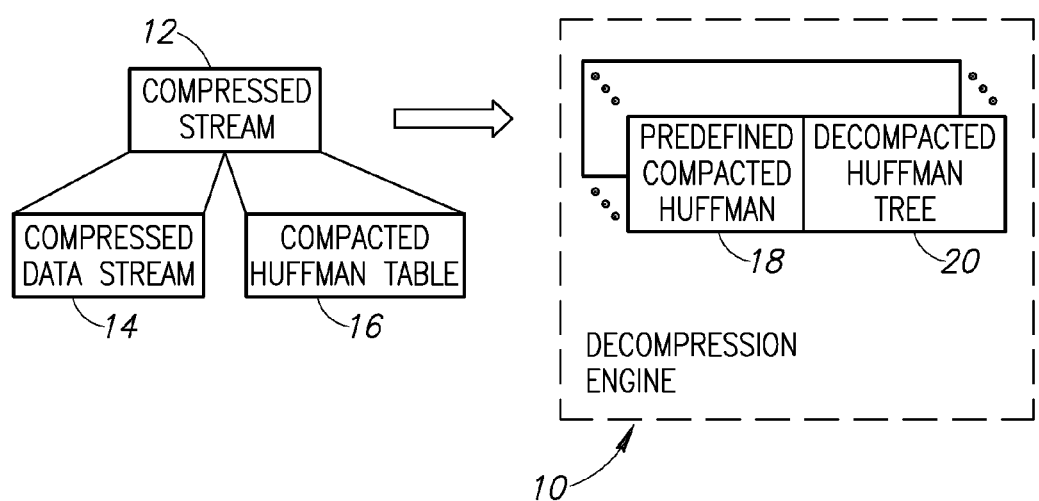
FIG. 2 is a high level block diagram illustrating an example compressed stream and decompression engine holding a table with predefined compacted Huffman and decompacted trees.

A high level block diagram illustrating an example compressed stream and decompression engine holding a table with predefined compacted Huffman and decompacted trees is shown in FIG. 2. The decompression engine 10 comprises, inter alia, a plurality of N predefined compacted Huffman trees 18 and decompacted Huffman trees 20.

In one embodiment, the pseudo DHT is not decompacted, but rather the hash of the Huffman tree is decompacted prior to decompaction. Already decompacted Huffman trees are used to reduce the time to perform decompression of the pseudo DHT. The invention provides an improvement in performance during the inflate/decompression by matching the Huffman tree prior to the decompaction, which takes a considerably shorter time than the decompaction step.

When a predefined Huffman tree is used for inflate/decompression, one of the N Huffman trees generated a priori is used. In one embodiment, these trees are typically sent as a DHT stream with one of them being selected for decompaction.

Figure 3:
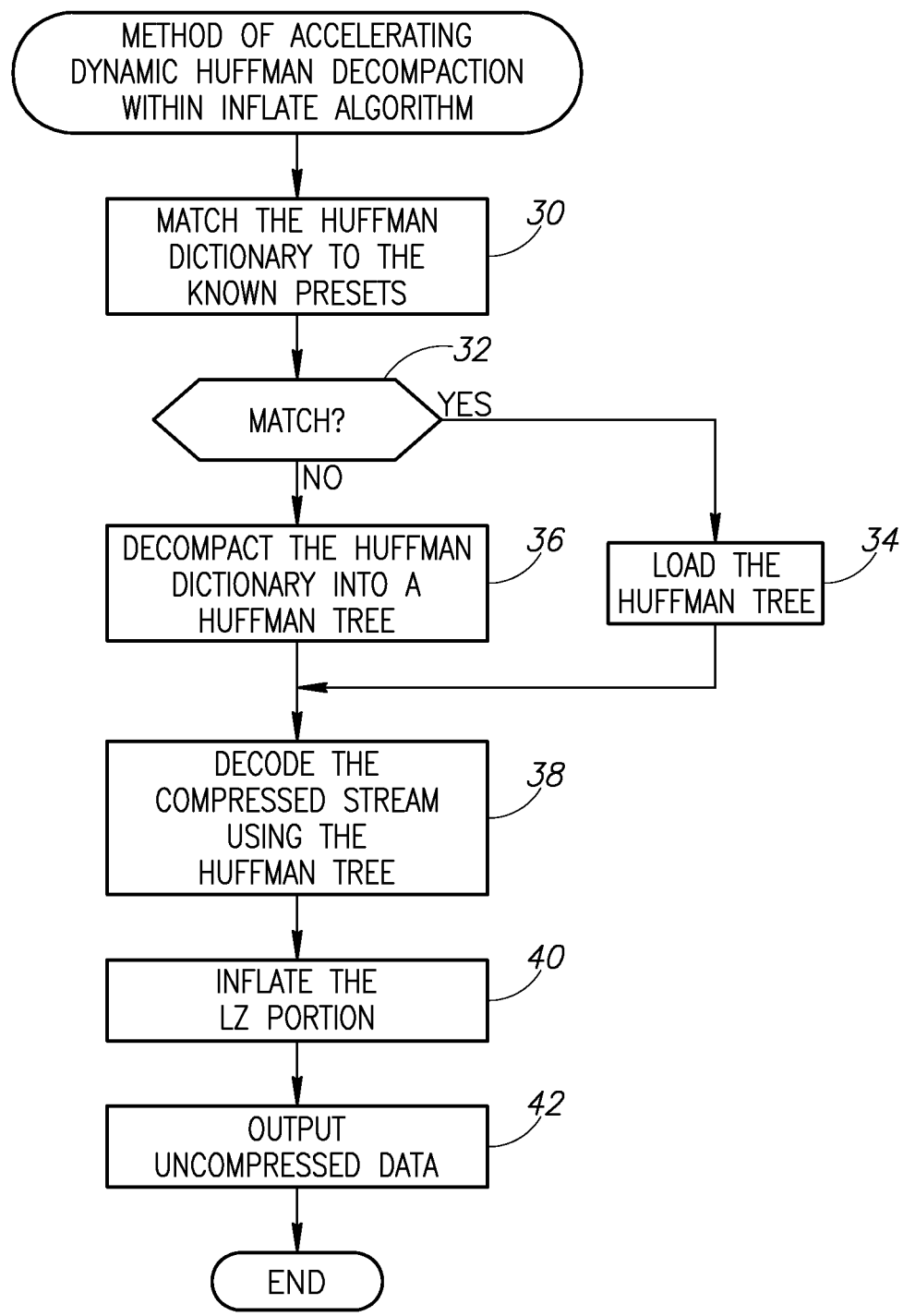
FIG. 3 is a flow diagram illustrating an example method of accelerating dynamic Huffman decompaction within the inflate algorithm.

A flow diagram illustrating an example method of accelerating dynamic Huffman decompaction within the inflate algorithm is shown in FIG. 3. First, the Huffman dictionary in the input compressed data stream is matched to the known predefined compacted Huffman presets (step 30). If no match is found (step 32), the compacted Huffman dictionary 16 (FIG. 2) in the input compressed data stream is decompacted (step 36). The input compressed data stream is then decoded using the decompacted Huffman tree (step 38). The LZ portion of the stream is inflated (step 40) and uncompressed data is output (step 42).

If a match is found (step 32), the corresponding particular decompacted Huffman tree 20 (FIG. 2) is loaded into the decompression engine hardware or memory (step 34). The method then continues with step 38, i.e. the input compressed data stream is then decoded using the decompacted Huffman tree (step 38). Thus, if a match is found, step 36 is avoided and performance of the decompression engine is improved as the step of decompacting the Huffman dictionary can be skipped.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of accelerating dynamic Huffman decompaction within an inflate process, said method comprising:
    receiving an input stream of compressed data;
    providing a bank of compacted and decompacted Huffman trees;
    matching the Huffman dictionary to know presets;
    if a match is found, loading the Huffman tree; and
    if a match is not found, decompacting the Huffman dictionary into a Huffman tree and decoding the compressed input stream using the Huffman tree from said bank.

2. The method according to claim 1, further comprising inflating a Lempel Ziv (LZ) portion of said input stream.

3. The method according to claim 2, further comprising outputting uncompressed data.

4. The method according to claim 2, wherein said bank of compacted and decompacted Huffman trees comprises a cache.

5. The method according to claim 2, wherein said bank of compacted and decompacted Huffman trees comprises a cache operative to capture repeating dynamic Huffman tree (DHT) over one or more presets.

6. The method according to claim 2, wherein said compacted Huffman is determined utilizing a hash function.

7. The method according to claim 2, wherein said compacted Huffman is determined by comparing all compacted Huffman trees in said bank to the compacted Huffman in said input stream.

* * * * *